United States Patent
Zhang et al.

(10) Patent No.: US 8,536,582 B2
(45) Date of Patent: Sep. 17, 2013

(54) STABLE POWER DEVICES ON LOW-ANGLE OFF-CUT SILICON CARBIDE CRYSTALS

(75) Inventors: Qingchun Zhang, Cary, NC (US); Anant Agarwal, Chapel Hill, NC (US); Doyle Craig Capell, Durham, NC (US); Albert Burk, Chapel Hill, NC (US); Joseph Sumakeris, Cary, NC (US); Michael O'Loughlin, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 90 days.

(21) Appl. No.: 12/622,861

(22) Filed: Nov. 20, 2009

(65) Prior Publication Data

US 2010/0133550 A1    Jun. 3, 2010

Related U.S. Application Data

(60) Provisional application No. 61/118,825, filed on Dec. 1, 2008.

(51) Int. Cl.
    *H01L 31/0312* (2006.01)
(52) U.S. Cl.
    USPC .............. 257/77; 257/E21.065; 438/478
(58) Field of Classification Search
    USPC ............ 257/77, E21.065, E29.104; 438/478
    See application file for complete search history.

(56) References Cited

U.S. PATENT DOCUMENTS

| 4,806,997 | A | 2/1989 | Simmons et al. |
| 5,011,549 | A | 4/1991 | Kong et al. |
| 5,093,576 | A * | 3/1992 | Edmond et al. ......... 250/370.01 |
| 7,230,274 | B2 * | 6/2007 | O'Loughlin et al. ........... 257/77 |
| 7,727,904 | B2 * | 6/2010 | Das et al. ...................... 438/770 |
| 7,768,017 | B2 * | 8/2010 | Nakayama et al. ............. 257/77 |
| 2006/0011128 | A1 * | 1/2006 | Ellison et al. ................... 117/84 |
| 2007/0057262 | A1 * | 3/2007 | Nakamura et al. .............. 257/77 |
| 2009/0078955 | A1 |  3/2009 | Fan et al. |
| 2009/0173997 | A1 * | 7/2009 | Fujihira et al. ................ 257/335 |
| 2010/0032685 | A1 | 2/2010 | Zhang et al. |
| 2010/0059850 | A1 * | 3/2010 | Harris .......................... 257/480 |

FOREIGN PATENT DOCUMENTS

| JP | H09-501270 A | 2/1997 |
| JP | 11-274482 A | 10/1999 |
| JP | 2001-035857 A | 2/2001 |
| JP | 2003-243648 A | 8/2003 |
| JP | 2005-167035 A | 6/2005 |
| WO | WO 95/05006 A1 | 2/1995 |
| WO | WO 2005/093796 A1 | 10/2005 |

OTHER PUBLICATIONS

European Search Report for corresponding EP patent application No. 09177558.5 dated Feb. 22, 2010, 6 pages.

Levinshtein et al., "On the homogeneity of the turn-on process in high voltage 4H-SiC thyristors", *Solid-State Electronics*, vol. 49, No. 2, Feb. 1, 2005, pp. 233-237, XP004645018 Elsevier Science Publishers, Barking (GB) ISSN: 0038-1101.

(Continued)

*Primary Examiner* — Phuc Dang (74) *Attorney, Agent, or Firm* — Myers Bigel Sibley & Sajovec, P.A.

(57) ABSTRACT

A silicon carbide-based power device includes a silicon carbide drift layer having a planar surface that forms an off-axis angle with a <0001> direction of less than 8°.

11 Claims, 6 Drawing Sheets

(56) References Cited

OTHER PUBLICATIONS

Palmour J: "Silicon Carbide npnp Thyristors", NASA Technical Briefs—Electronics and Computers, Dec. 1, 2000, John H. Glenn Research Center, Cleveland, Ohio (US); XP-002567723, http://www.techbriefs.com/component/content/article/7031-lew-16750?tmpl=component&print=1&page.

Submission of Publications for corresponding Japanese Patent Application No. 200-272182 filed Mar. 30, 2012 with translation, 29 pages.

Okamoto et al, "Electrical Properties of p-channel MOSFETs Fabricated on 4H and 6H-SIC", Materials Science Forum vols. 556-557, pp. 783-786, 2007.

Tsuchida et al., "Comparison of Propagation and Nucleation of Basal Plane Dislocations in 4H-Sic(000-1) and (0001) Epitaxy", Materials Science Forum vol. 525-529, pp. 231-234, 2006.

"Semiconductor SiC technology and application", edited by Hiroyuki Matsunami, pp. 33-39, pp. 58-59 and pp. 222-223, Mar. 31, 2003.

Japanese Office Action Corresponding to Japanese Patent Application No. 2009-272182; Mailing Date: Nov. 20, 2012; Foreign Text, 4 pages, English Translation Thereof, 4 pages.

Japanese Office Action Corresponding to Japanese Patent Application No. 2011-538639; Mailing Date: Nov. 20, 2012; Foreign Text, 3 pages, English Translation Thereof, 5 Pages.

\* cited by examiner

STABLE POWER DEVICES ON LOW-ANGLE OFF-CUT SILICON CARBIDE CRYSTALS

CROSS-REFERENCE TO PROVISIONAL APPLICATION

This application claims the benefit of, and priority from, Provisional Application Ser. No. 61/118,825, filed Dec. 1, 2008 entitled STABLE POWER DEVICES ON LOW-ANGLE OFF-CUT SILICON CARBIDE CRYSTALS, the disclosure of which is hereby incorporated herein by reference in its entirety as if set forth fully herein.

STATEMENT OF GOVERNMENT INTEREST

This invention was developed under government Contract No. W911NF-04-2-0022 awarded by Army Research Laboratory. The U.S. Government has certain rights in this invention.

FIELD

The present invention relates to methods of fabricating semiconductor materials used in electronic devices, such as power electronic devices. In particular, some embodiments of the invention relate to processes that can reduce crystal defects in silicon carbide, and the resulting structures and devices.

BACKGROUND

Silicon carbide (SiC) has emerged over the last two decades as an appropriate candidate semiconductor material that can offer a number of advantages over both silicon and gallium arsenide. In particular, silicon carbide has a wide bandgap, a high breakdown electric field, a high thermal conductivity, a high saturated electron drift velocity, and is physically extremely robust. Silicon carbide has an extremely high melting point and is one of the hardest known materials in the world.

Because of its physical properties, however, silicon carbide also may be relatively difficult to produce. Because silicon carbide can grow in many polytypes, it may be difficult to grow into large single crystals. The high temperatures used to grow silicon carbide also may make control of impurity levels (including doping) relatively difficult, and likewise may raise difficulties in the production of thin films (e.g. epitaxial layers). Because of its hardness, the traditional steps of slicing and polishing semiconductor wafers also may be more difficult with silicon carbide. Similarly, its resistance to chemical attack may make it difficult to etch in a conventional fashion.

In addition, silicon carbide can form over 150 polytypes, many of which are separated by relatively small thermodynamic differences. As a result, growing single crystal substrates and high quality epitaxial layers ("epilayers") in silicon carbide has been, and may remain, a difficult task.

Nevertheless, based on a great deal of research and discovery in this particular field, including that carried out by the assignee of the present invention, a number of advances have been made in the growth of silicon carbide and its fabrication into useful devices. Accordingly, commercial devices are now available that incorporate silicon carbide as a substrate for other useful semiconductors such as the Group III nitrides, to produce blue and green light emitting diodes. Also, commercial silicon carbide-based devices are available for microwave and radio frequency (RF) high-power, high-voltage applications, and/or for other applications.

As the success of silicon-carbide technology has increased the availability of certain SiC-based devices, particular aspects of those devices have become more apparent. In particular, it has been observed that the forward voltage (Vf) of some silicon carbide-based bipolar devices such as bipolar power devices may increase noticeably during operation of some devices. This increase is generally referred to as "Vf drift." For a number of reasons, such functional problems in semiconductor devices can often result from defects in the crystal structure of the material from which the devices are formed. Examples of these defects are discussed below.

Deposition systems and methods are commonly used to form layers of semiconductor materials, such as thin epitaxial films, on substrates. For example, a chemical vapor deposition (CVD) reactor system and process may be used to form a layer of semiconductor material such as silicon carbide (SiC) on a substrate. CVD processes may be particularly effective for forming layers with controlled properties, thicknesses, and/or arrangements such as epitaxial layers. Typically, in a deposition system, such as a CVD system, the substrate is placed in a reaction chamber within a susceptor and one or more process gases including reagents or reactants to be deposited on the substrate are introduced into the chamber adjacent the substrate. The process gases may be flowed through the reaction chamber in order to provide a uniform or controlled concentration of the reagents or reactants to the substrate.

A deposition system, such as a CVD reactor, may be used to form epitaxial layers of silicon carbide on a single crystal silicon carbide substrate having a predetermined polytype such as 2H, 4H, 6H, 15R, 3C and the like. The term "polytype" refers to the ordering and arrangement of layers of atoms within a crystal structure. Thus, although the different polytypes of silicon carbide are stoichiometrically identical, they possess different crystal structures and consequently may have different material properties such as bandgap, carrier mobility and breakdown field strength. The letters H, R and C refer to the general crystal structure of the polytype, namely, hexagonal, rhombohedral and cubic, respectively. The numbers in the polytype designations refer to the repetition period of layer arrangements. Thus, a 4H crystal has a hexagonal crystal structure in which the arrangement of atoms in a crystal repeats every four bi-layers.

Figure 1:
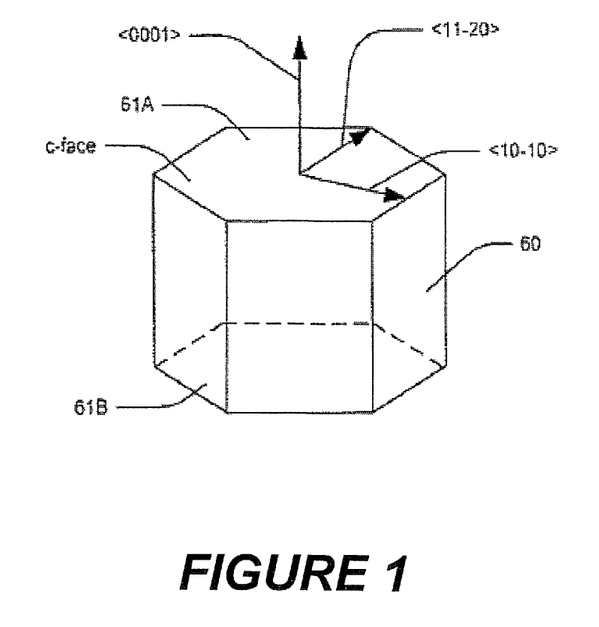
FIG. 1 is a schematic diagram of a hexagonal crystal unit cell structure.

FIG. 1 illustrates a hexagonal unit cell of a hypothetical crystal. The unit cell 60 includes a pair of opposing hexagonal faces 61A, 61B. The hexagonal faces are normal to the c-axis, which runs along the <0001> direction as defined by the Miller-Bravais indexing system for designating directions in a hexagonal crystal. Accordingly the hexagonal faces are sometimes called the c-faces, which define the c-planes or basal planes of the crystal. Planes perpendicular to the c-plane are referred to as prismatic planes.

Silicon carbide possesses a number of potentially advantageous physical and electronic characteristics for semiconductor performance and devices. These may include a wide bandgap, high thermal conductivity, high saturated electron drift velocity, high electron mobility, superior mechanical strength, and radiation hardness. However, the presence of crystalline defects in silicon carbide films may limit the performance of electronic devices fabricated in the films, depending on the type, location, and density of the defects. Accordingly, significant research has focused on reducing defects in silicon carbide films. Certain defects, such as micropipes, are known to severely limit and even prevent device performance. Other defects, such as threading dislocations, are not considered to be individually catastrophic to device operation, and therefore they may not significantly impact device performance at densities normally found in epitaxial films.

Figure 2:
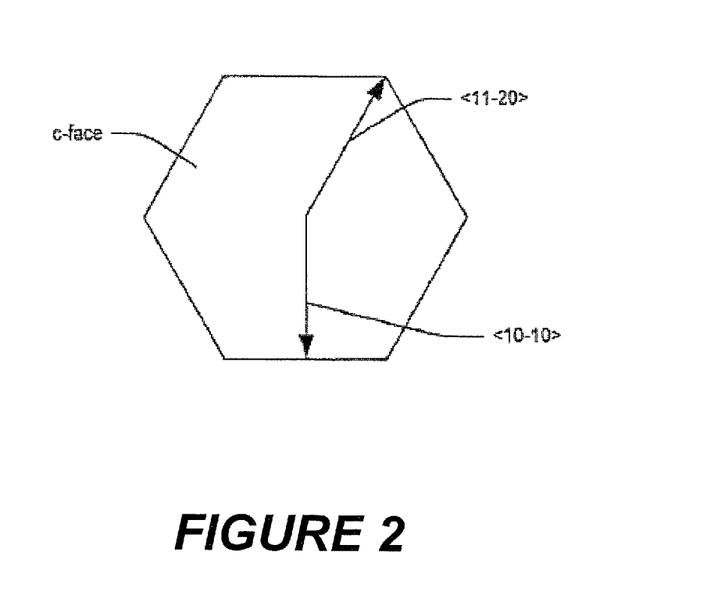
FIG. 2 is a top view of a hexagonal unit cell illustrating standard crystallographic directions.

For applications where a high voltage blocking capability is desired (for example power switching applications), silicon carbide films are usually grown "off-axis." That is, the substrate crystal is sliced at an angle that is slightly oblique to the normal crystal axis (the c-axis). Taking for example a hexagonal polytype such as 4H or 6H, the oblique angle of the cut may be made in one of the standard crystallographic directions illustrated in FIG. 2, namely the $<11\bar{2}0>$ direction (towards a point of the hexagonal unit cell) or the $<10\bar{1}0>$ direction (towards the center of a flat side of the hexagonal unit cell), or along a different direction. As a result of the off-axis slicing, the face of a prepared substrate may be characterized by a periodic arrangement of plateaus and steps. See, for example, U.S. Pat. No. 4,912,064 to Kong et al, entitled Homoepitaxial Growth of Alpha-SiC Thin Films and Semiconductor Devices Fabricated Thereon, assigned to North Carolina State University, the disclosure of which is hereby incorporated herein by reference in its entirety as if set forth fully herein.

Figure 3:
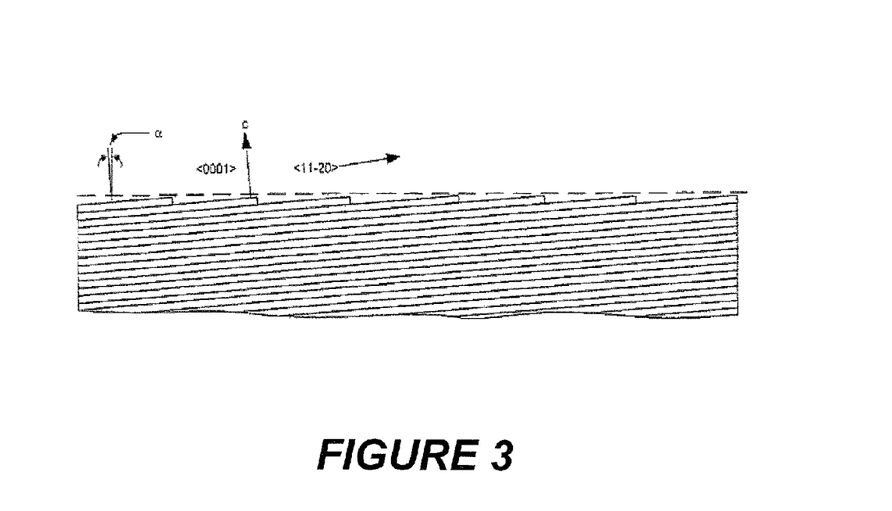
FIG. 3 is a schematic side view of an off-axis silicon carbide crystal.

Thus when an epitaxial layer is grown on the substrate, the deposited atoms bond to atoms at the exposed edges of the crystal layer steps, which causes the steps to grow laterally in so-called step-flow fashion. Step-flow growth is illustrated in FIG. 3. Each layer or step grows in the direction in which the crystal was originally cut off-axis (the $<11\bar{2}0>$ direction in the case illustrated in FIG. 3).

Crystallographic Defects

At the most basic level, structural crystallographic defects may fall into four categories: point defects, line defects, planar defects and three dimensional defects. Point defects include vacancies, line defects include dislocations, planar defects include stacking faults and three-dimensional defects include polytype inclusions.

A dislocation is a kind of structural imperfection that extends for many unit cell lengths throughout a crystal. A more definite description of dislocation may classify them as screw and edge dislocations. As recognized by those persons skilled in this art, a symmetrical path followed from atom to atom (or from ion to ion) in a real crystal that returns upon itself, is referred to as a Burgers circuit. If the same path in the lattice that typifies the structure does not return upon itself, so that the beginning and end do not lie on the same atom, then the Burgers circuit encloses one or more dislocations. The vector that completes the closed circuit in the lattice is referred to as the Burgers vector and measures the magnitude and direction of the dislocation.

If the Burgers vector is parallel to the line that locates the dislocation, the defect is referred to as a screw dislocation. Alternatively, if the Burgers vector is perpendicular to the dislocation, it is referred to as an edge dislocation. The simplest version of an edge dislocation is an incomplete plane of atoms or ions interleaved between two normal planes in a manner somewhat analogous to an extra card inserted halfway into a deck.

Screw dislocations are not necessarily disadvantageous and, in fact, can be advantageous for the growth of a crystal. For example, a 1C threading screw dislocation at the nominally (0001) oriented growth surface of a silicon carbide crystal presents a regenerating edge that is one or a few atoms high. At this edge, continued growth of the crystal is relatively easy. Dislocations, however, allow plastic flow to occur in a crystal relatively easily. Dislocations may move preferentially along slip planes. The dislocation moves relatively easily through the crystal because motion in the slipped plane involves only a slight displacement of the structural elements. Stated differently, the slipped planes provide a low-energy intermediate state by which a crystal can be reorganized.

Defects in Silicon Carbide

In silicon carbide power devices, the availability of such a relatively low-energy intermediate state may encourage faults to continue to grow, since the operation of the device can provide the relatively small amount of energy that may be required to drive dislocation motion.

Commercial quality SiC wafers and epilayers typically include both screw and edge dislocations. These dislocations can be further grouped by their alignment within the crystal. Those dislocations that propagate along the c-axis are called threading dislocations, while dislocations that lie within the c-plane are termed basal plane dislocations. In general, in SiC, it is energetically favorable that basal plane dislocations may preferentially decompose into partial dislocations via the mechanism described below:

$$\frac{1}{3}<11\bar{2}0> \rightarrow \frac{1}{3}<10\bar{1}0> + \frac{1}{3}<01\bar{1}0> \qquad \text{Equation 1}$$

The above decomposition reaction describes the decomposition of a basal plane dislocation into two Shockley partial dislocations. The line defects generated during the above decomposition will bound a stacking fault defect. In fact, partial dislocations will generally bind the entire perimeter of the stacking fault unless the stacking fault reaches a free surface. This stacking fault will generally be electrically active in bipolar devices, and, during forward operation, the density of the electron-hole plasma may be reduced in the vicinity of the stacking fault. The reduced plasma density may increase the forward voltage of the device. A further potential complication is that through recombination enhanced dislocation glide, the stacking fault may continue to expand during forward operation of the device. This behavior can raise a substantial barrier to device exploitation because it can result in devices with functional properties that can change unpredictably during operation.

Stated differently, the application of electric current through a silicon carbide bipolar device may tend to initiate or propagate (or both) changes in the crystal structure due to preexisting defects in the crystal. As noted above, many SiC polytypes are in close thermodynamic proximity, and solid phase transformations are quite possible. When the stacking faults impact a significant portion of the active area of a device, they tend to cause the forward voltage to increase in an undesirable manner that can prevent the device from operating as precisely and/or efficiently as required or desired in many applications.

In some conventions, dislocation density is described by centimeters of dislocation length per cubic centimeter of material, and thus report dislocation density units of per square centimeter ($cm^{-2}$). In another convention (and as used herein) the off-axis orientation of 4H-SiC substrates for SiC epilayer growth and the common etch technique used to detect dislocations make it more convenient to use etch pit density (also in the units of $cm^{-2}$), to describe dislocation densities in SiC. Those of skill in this art will thus recognize that for a given dislocation density expressed as $cm/cm^3$, one could get a very different dislocation pit density when expressed as $pits/cm^2$ depending on the typical dislocation configuration and the off-axis angle of the substrate. Therefore, although the two numbers will have the same net units ($cm^{-2}$), they do not necessarily indicate the same actual dislocation density. For the sake of clarity and consistency, in the present application, dislocation density will be described as the density of specific pits delineated on an etched epi-surface of a silicon carbide substrate.

Present commercially available 4H-SiC substrates may have approximately 1E3 to 1E5 (about $10^3$-$10^5$) dislocations per $cm^2$ by the convention used herein. This includes threading screw and edge dislocations and basal plane dislocations. Presumably, all types of dislocations can impact device performance. but the basal plane dislocation has been particularly implicated as the prevalent nucleation site of the stacking faults that may cause $V_f$ drift.

In turn, defects in the substrate are often replicated in epitaxial layers grown on such substrates, thus making substrate crystal quality a factor with respect to the quality and performance of resulting devices.

Conventional substrate preparation and epilayer growth practices can fairly effectively reduce the density of basal plane dislocations from 1E3-1E4 $cm^{-2}$ in the substrate to about 400 $cm^{-2}$ in the epilayer. This reduction in dislocation density may be accomplished via changes in both the substrate preparation and the epilayer growth operations.

Accordingly, for continued improvement in the structure and operation of SiC-based bipolar and other devices it may be desirable to provide continued improvement in the underlying substrates and their crystal structures.

SUMMARY

A silicon carbide-based power device according to some embodiments includes a silicon carbide drift layer having a planar surface that forms an off-axis angle with a <0001> direction of greater than 0° and less than 8°.

In some embodiments, the off-axis angle with the <0001> direction may be between about 4° or less. In further embodiments, the off-axis angle with the <0001> direction may be between about 2° and about 4°, and in still further embodiments, the off-axis angle with the <0001> direction may be about 4°.

The off-axis angle may be inclined towards the <11$\bar{2}$0> direction. In some embodiments, the off-axis angle may be inclined towards the <10$\bar{1}$0> direction.

The silicon carbide based power device may further include a silicon carbide substrate having a planar surface that forms an off-axis angle with the <0001> direction of greater than 0° and less than 8°, and the silicon carbide drift layer may include an epitaxial layer on the planar surface of the silicon carbide substrate.

The silicon carbide based power device may further include a silicon carbide buffer layer between the silicon carbide substrate and the silicon carbide drift layer. The silicon carbide buffer layer may have a thickness of at least about 10 μm In some embodiments, the silicon carbide buffer layer may have a thickness between about 10 μm and about 25 μm.

The buffer layer may have a basal plane dislocation density at a surface opposite the substrate of less than about 10/$cm^2$. In some embodiments, the buffer layer may have a basal plane dislocation density at the surface opposite the substrate of less than about 2/$cm^2$, and in some embodiments, the buffer layer may have a basal plane dislocation density at the surface opposite the substrate of less than about 1/$cm^2$.

The silicon carbide buffer layer may be on a carbon face of the silicon carbide substrate.

In some embodiments, the silicon carbide drift layer may include a bulk silicon carbide substrate.

The silicon carbide based power device may include a bipolar power device and/or a unipolar power device.

The silicon carbide based power device may be a gate turn off thyristor including a silicon carbide substrate having a second conductivity type opposite the conductivity type of the drift layer and a silicon carbide buffer layer on the substrate. The drift layer may be on the buffer layer. A first epitaxial layer may be on the drift layer and may have the second conductivity type, a second epitaxial layer may be on the first epitaxial layer and have the first conductivity type, a gate contact may be on the first epitaxial layer, a cathode contact may be on the second epitaxial layer, and an anode contact may be on the substrate.

The off-axis angle with the <0001> direction may be about 4°, and the device may exhibit a forward voltage drift of less than 100 mV after 40 hours of conducting forward current.

Methods of forming a silicon carbide-based power device according to some embodiments include forming a silicon carbide drift layer having a planar surface that forms an off-axis angle with a <0001> direction of less than 8°.

DETAILED DESCRIPTION

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on" another element or layer, it can be directly on the other element or layer or intervening elements or layers may be present. In contrast, when an element is referred to as being "directly on" another element or layer, there are no intervening elements or layers present. Like numbers refer to like elements throughout. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Thus, for example, three or more epitaxial layers may be grown according to embodiments of the invention even though growth of two layers is described herein.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore. encompass both an orientation of above and below.

Embodiments of the present invention are described herein with reference to cross-sectional and/or other views that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a grown or deposited region illustrated as a polygon will, typically, have rounded or curved features and/or a gradient of concentrations at its edges with another region rather than a discrete change from a first region to a second region of different composition. Thus, the regions illustrated in the figures are schematic in nature and their shapes are not intended to illustrate the precise shape of a region of a device and are not intended to limit the scope of the present invention.

The term "substrate" is used herein in a sense that is broad enough to include both a bulk single crystal (usually cut from a boule) as well as a device precursor structure, such as a wafer, that can include one or more epitaxial layers, but which fundamentally (although not necessarily exclusively) serves as the physical and electronic support for a device formed thereon.

Generally—but not necessarily—the substrate will be n-type, because n-type substrates may offer a number of advantages in silicon carbide-based devices, and may have an activated carrier concentration of about 1E18-1E19 ($1\times10^{18}$-$1\times10^{19}$) carriers per $cm^3$. In comparison to the substrate, the carrier concentration of the epitaxial layer may be selected (or described) in terms of its purpose. "Conductive" layers may typically have a carrier concentration of 1E18-19 $cm^{-3}$. "Blocking" layers may typically have carrier concentrations less than 1E16 $cm^{-3}$. "Active" layers may have carrier concentrations within these parameters, depending on the structure or purpose of the end device. Accordingly, although terms such as n, n+ and n− can be used to describe both substrates and epilayers, such terminology should be considered in an illustrative rather than a limiting sense.

The silicon carbide substrate upon which the device is formed can be taken from a larger crystal (or "boule"), typically by the steps of sawing a silicon carbide substrate wafer from a silicon carbide boule, and thereafter conducting a nonselective etch on the substrate wafer. In most circumstances, the sawed substrate wafer is lapped, polished, etched (typically RIE), and cleaned (with an acid or solvent) prior to conducting a first patterned etch according to some embodiments of the invention. The term "lapped" is used in its typical sense; i.e., to describe the steps of flattening the wafer surfaces using a counter-rotating lapping machine and an abrasive (e.g. diamond) slurry. Lapping can help make the wafer surfaces parallel and can reduce mechanical defects such as saw markings. Similarly, the polishing, etching and cleaning steps may be otherwise carried out conventionally prior to steps of the present invention.

Some embodiments of the invention can advantageously reduce the density of basal plane dislocations (BPDs) in the epilayer. Power devices formed using epitaxial layers with low BPD density may experience less Vf degradation.

Figure 4:
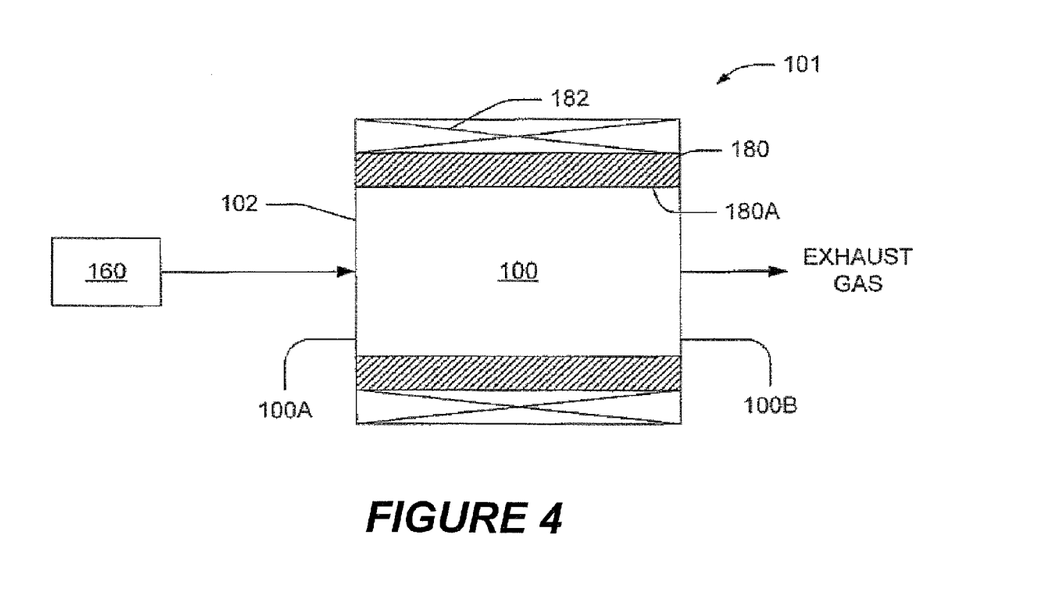
FIG. 4 is a schematic view of an epitaxial deposition system.
Figure 5:
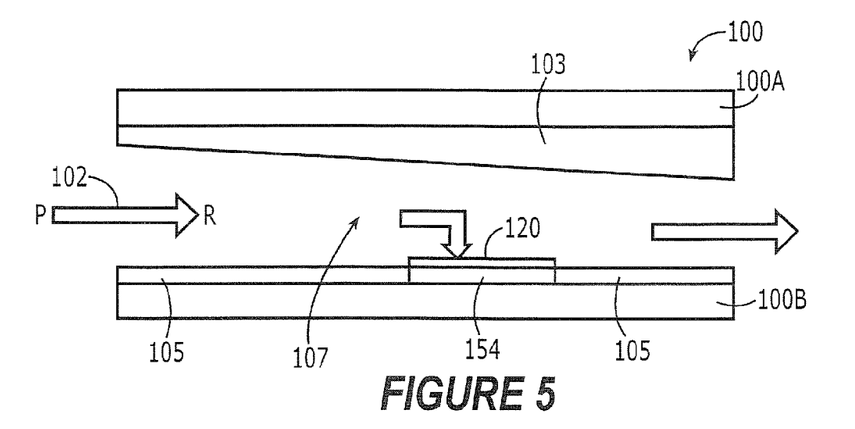
FIG. 5 is a cross section of a susceptor assembly that can form a part of the deposition system of FIG. 4.

A deposition system 101 in which some embodiments of the present invention may be practiced is schematically shown in plan view in FIG. 4. The deposition system 101 may be a horizontal, hot wall, flow through, CVD system as shown including a susceptor assembly 100, a quartz tube 180 defining a through passage 180A, an electromagnetic frequency (EMF) generator 182 (for example, including a power supply and an RF coil surrounding the tube 180) and a process gas supply 160. An insulative cover may be provided about the susceptor assembly 100 in addition to or in place of the quartz tube 180. The deposition system 101 may be used to form a layer or film on a substrate 120 (FIG. 5). While only a single substrate 120 is illustrated in FIG. 5, the system 101 may be adapted to form films concurrently on multiple substrates 120.

The substrate 120 may be a wafer or other structure formed of the same or a different material than that of the layer to be deposited. The substrate 120 may be formed of, for example, 2H-, 4H- or 6H-SiC or any other suitable material. The substrate surface upon which the film is deposited may be a base substrate or a first or subsequent layer superimposed on a base substrate. For example, the surface of the substrate 120 for receiving the deposited film may be a layer previously deposited using the deposition system 101 or an alternative apparatus. As will be appreciated by those of skill in the art in light of the present disclosure, embodiments of the present invention may be advantageously utilized with semiconductor materials other than those specifically mentioned herein.

Generally, the process gas supply 160 supplies a process gas into and through the susceptor assembly 100 as discussed below. The EMF generator 182 inductively heats the susceptor assembly 100 to provide a hot zone in the susceptor assembly 100 where deposition reactions take place. The process gas continues through and out of the susceptor assembly 100 as an exhaust gas that may include remaining components of the process gas as well as reaction by-products, for example. Embodiments of the present invention may use types of deposition systems other than hot wall CVD systems. Other modifications to the systems and methods of the present invention will be apparent to those of ordinary skill in the art upon reading the description herein.

The process gas may include one or more components such as reagents, reactants, species, carriers and the like. Where it is desired to form a SiC layer on a substrate, the process gas may include precursor gases such as silane ($SiH_4$) and propane ($C_3H_8$) along with a carrier gas such as purified hydrogen gas ($H_2$). The process gas supply 160 may be provided from one or more pressurized containers of the gases with flow control and/or metering devices as needed.

An exemplary conventional susceptor 100 is shown in FIG. 5. The susceptor 100 may be used, for example, in a flow through, hot wall, and/or CVD reactor, such as was illustrated in FIG. 4. The susceptor 100 has a top susceptor member 100A and a bottom susceptor member 100B. The susceptor 100 also has a top liner 103 and a bottom liner 105 defining a reaction chamber 107 therebetween. A substrate 120, such as a semiconductor wafer, is positioned in the reaction chamber 107 and may be situated on an interior surface of a platter 154 (which may rotate), for example. A process gas P is introduced to the reaction chamber 107 at one end, flowed through the reaction chamber 107 past the substrate 120, and finally exhausted from the reaction chamber 107 at the opposite end. As used herein, the term process gas refers to one or more gases. As indicated by the arrows in the reaction chamber 107 as shown in FIG. 5, as the process gas flows through the reaction chamber 107 a portion of the process gas may contact the substrate 120 as intended and thereby deposit the reagents or reactants on the substrate 120 to form a layer thereon. In some systems, the reaction chamber 107 may have a length of between about 0.1 and 1 meter, a width of between about 0.05 and 0.5 meter, and a height of between about 1 and 10 cm. The reaction chamber 107 is not limited to these dimensions, however. The susceptor members may include high quality graphite. Examples of CVD deposition systems including susceptor designs are found in U.S. Patent Publication No. US 2003/0079689 entitled Induction Heating Devices and Methods for Controllably Heating an Article and U.S. patent application Ser. No. 10/414,787, filed Apr. 16, 2003 entitled Methods and Apparatus for Controlling Formation of Deposits in a Deposition System and Depositions Systems and Methods Including the Same both of which are incorporated herein by reference in their entireties.

In certain embodiments, the susceptor members 100A, 100B are formed of a material suitable to generate heat responsive to eddy currents generated therein by the EMF generator 182, such materials and inductive heating arrangements being well known to those of skill in the art. The members may be formed of graphite, and more preferably of high purity graphite.

A platter 154 or the like may be situated between the bottom member 100B and the substrate 120 to support the substrate 120. According to some embodiments, the platter 154 may be rotatively driven by a suitable mechanism (not shown). For example, the system may include a gas-driven rotation system as described in U.S. application Ser. No. 09/756,548, entitled Gas Driven Rotation Apparatus and Method for Forming Silicon Carbide Layers, filed Jan. 8, 2001, and/or as described in U.S. application Ser. No. 10/117,858, entitled Gas Driven Planetary Rotation Apparatus and Methods for Forming Silicon Carbide Layers, filed Apr. 8, 2002, the disclosures of which are hereby incorporated herein by reference in their entireties. Alternatively, the platter 154 may be stationary. The platter 154 may be adapted to hold one or multiple substrates 120. The platter 154 may be formed of any suitable material such as SiC coated graphite, solid SiC and/or solid SiC The platter 154 may be omitted such that the substrate rests on the susceptor member 100B, the liner 105, or other suitable support.

In use, the process gas supply 160 supplies a flow of the process gas P to the reaction chamber 107 through the inlet opening 102. The process gas P flows generally in a flow direction R. As shown, some portion of the process gas and the reagents therein contact the substrate 120 to form the desired layer (e.g., an epilayer) on the exposed surface of the substrate 120.

While the foregoing deposition system 101 and methods are described as relating to a horizontal, hot wall, CVD, flow through deposition process, various aspects of the present invention may be used in other types of deposition systems and processes. While particular embodiments have been described with reference to "top", "bottom" and the like, other orientations and configurations may be employed in accordance with the invention. For example, the deposition system and process may be a cold wall and/or non-horizontal flow through system and process. The deposition system and process may be a vapor phase epitaxy (VPE), liquid phase epitaxy (LPE), or plasma enhanced CVD (PECVD) deposition system and process rather than a CVD system or process.

Figure 6:
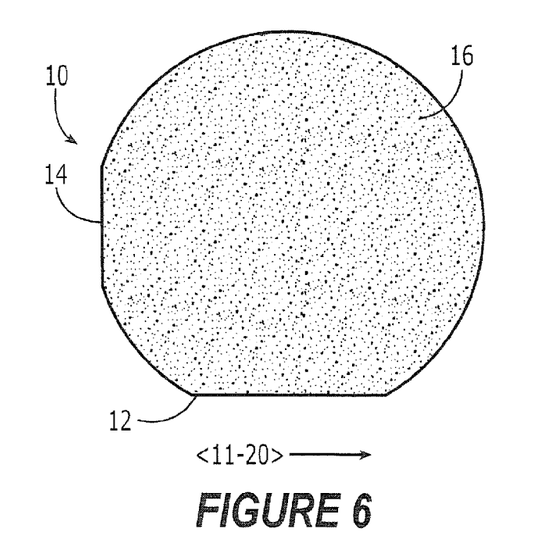
FIG. 6 is a schematic view of a SiC wafer that has been processed in accordance with some embodiments of the invention.

Referring now to FIG. 6, a single crystal silicon carbide substrate wafer 10 on which one or more epitaxial layers is to be grown has a generally circular perimeter. A pair of flats has been milled into the wafer to assist in wafer orientation. In particular, the wafer 10 includes a primary flat 12 and a secondary flat 14. The primary flat 12 runs along the <11$\bar{2}$0> direction, while the secondary flat 14 is oriented along the <10$\bar{1}$0> direction.

The surface 16 of the wafer corresponds generally to the c-face of the silicon carbide crystal (except that the wafer has been cut at an off-axis angle α towards the <11$\bar{2}$0> direction. In some embodiments, the surface 16 of the wafer corresponds to the silicon-face of the wafer, while in other embodiments the surface 16 of the wafer corresponds to the carbon-face of the wafer.

The off-axis angle α may be less than about 8° in some embodiments. In some embodiments, the off-axis angle α may be from 0° to less than about 8°. In further embodiments, the off-axis angle α may be from 0° to less than about 4°. In still further embodiments, the off-axis angle α may be from about 2° to less than about 4°.

Previously, SiC power devices have been grown on 8° off-axis silicon carbide epitaxial layers. However, such device have suffered from performance degradation. In particular, such performance degradation can include increase in forward voltage drop (Vf drift), current gain reduction, and/or increase in reverse leakage current.

As discussed above, with reference to FIG. 3, off-axis epitaxial growth proceeds in a step-flow fashion, which takes advantage of exposed edges of c-plane oriented layers that facilitates two-dimensional growth of epitaxial layers in a manner that generally preserves polytype information in the growing epitaxial layer. Step-flow growth of epitaxial layers on 8° off-axis oriented SiC wafers can result in thick epitaxial layers with smooth morphology that is suitable for power devices. However, one drawback of using 8° off-axis epitaxial layers for SiC power devices is that such growth can lead to basal plane dislocations. It has been shown that BPDs are a fundamental cause of many of the types of performance degradation mentioned above. In particular, the extended growth of BPDs to stacking faults within the active area of a power device while forward biasing the P-N junction results in recombination of electrons and holes in the drift region. Such recombination enhances the glide of the partial dislocations bounding the stacking fault in the basal planes. The presence of the stacking faults can locally reduce the carrier lifetime and/or create excess interface defects within the SiC crystal.

It has been proposed to reduce BPDs in SiC epitaxial layers by reducing the off-axis angle of the growth substrate to an angle less than 8°. However, the growth of epitaxial layers at off-axis angles less than 8° that are sufficiently thick and have acceptable morphology to function in SiC power devices has proven difficult.

According to some embodiments, improved thick epitaxial layer growth conditions enable the growth of high-quality low-angle off-axis epitaxial layers that can be used as a basis to form silicon carbide power devices. In particular, some embodiments provide methods of forming high-quality, low defect density epitaxial layers of silicon carbide on substrates that are oriented on-axis or off-axis from the (0001) basal plane by an angle that is less than 8°. Layers grown in this fashion have exhibited low BPD densities, and therefore low Vf drift and other associated performance degradation.

As will be appreciated from FIG. 3, as off-axis angles are decreased, the number of exposed steps per unit distance on the face of a SiC wafer also decreases. Given the low surface mobility of silicon on a SiC wafer surface, the growth of epitaxial layers becomes more difficult as the number of steps decreases and the steps are spaced farther and farther apart. Accordingly, as the off-axis angle of the substrate is decreased, it may be desirable to take steps, such as increasing the growth temperature and/or increasing the Si/C ratio of source atoms supplied to the substrate, that may increase the mobility of silicon atoms across the surface of the substrate.

For example, 8° off-axis epitaxial silicon carbide is typically grown at a temperature of about 1500-1550° C. According to some embodiments, the epitaxial growth temperature may be increased above 1550° C., and in some cases may be increased up to about 1800° C., or otherwise up to a temperature at which the etch rate of the epitaxial layer due to the hydrogen carrier gas exceeds the epitaxial growth rate. In some embodiments, the epitaxial growth may be performed at a temperature of about 1600° C. to about 1800° C. In further embodiments, the epitaxial growth may be performed at a temperature of about 1600° C. to about 1700° C.

In some embodiments, the surface mobility of Si atoms across the substrate can be increased by increasing the Si/C ratio of reactant gases provided to the reaction chamber. However, it will be appreciated that changing the Si/C ratio can also change the morphology of the growing layer and/or alter dopant incorporation rates.

In some embodiments, epitaxial growth can be performed on the carbon face of a SiC substrate, as opposed to the more conventionally used silicon face. Silicon atoms may have better mobility across the carbon face of a substrate, since the surface free energy is typically lower on the carbon face. One drawback of using the carbon face for epitaxial growth is that the background dopant concentration levels may be higher when growing on the carbon face. For power devices, background dopant concentrations can greatly affect the blocking voltage of the device. Typically, drift regions of power devices have net dopant concentrations less than $10^{16}$ cm$^{-3}$, and in some cases less than $10^{16}$ cm$^{-3}$. However, even when growing on a carbon face, background dopant concentrations can be kept to less than about $10^{15}$ cm$^{-3}$.

Alternatively the addition of a chlorine containing compound, such as HCl, may reduce Si-supersaturation induced deposits that may inhibit step-flow growth, effectively increase the Si-surface adatom mobility, and/or slightly increase the dynamic co-etch that occurs during epitaxial growth of SiC in hydrogen. The etch rate is typically about 0.5 to about 3 microns/hour, increasing mainly with increasing temperature. All of these effects may enhance the operative step-flow growth mechanism and resulting quality of the epitaxial layer. This added benefit is more important for low off-axis orientations with the correspondingly wider terrace widths.

In some embodiments, a silicon carbide power device can include a low-angle off-cut epitaxial layer having a total density of catastrophic defects, such as basal plane dislocations (BPDs), of less than 10 defects per square centimeter. In some embodiments, a silicon carbide power device can include an epitaxial layer having a density of BPDs of less than 2/cm$^2$, and in some embodiments less than about 1/cm$^2$. As used herein, the term "catastrophic defect" refers to a defect that would prevent a power device from functioning. Catastrophic defects are typically identified and characterized by means of light scattering techniques that are well known in the art. Basal plane defects can also be identified, for example, by defect selective etching in molten potassium hydroxide (KOH) and counting the number of characteristic etch pits that form in response to the etch.

Basal plane dislocations can be reduced during growth of an epitaxial silicon carbide layer having an off-axis angle of less than 8°. In particular, it is presently believed that BPDs can terminate within an epitaxial layer having an off-axis angle of less than 8° when the epitaxial layer is grown to a sufficient thickness. That is, although some BPDs may propagate into the epitaxial layer from the substrate/epitaxial layer interface, a number of BPDs may terminate or be converted into other types of non-catastrophic defects at some distance within the epitaxial layer.

In some embodiments, a silicon carbide based power device includes a buffer layer on a substrate. A drift layer and/or other device layers may be formed on the buffer layer. The buffer layer, which may be doped with n-type and/or p-type dopants, is an epitaxial layer of silicon carbide in which some or all BPDs in the layer terminate. The buffer layer may have a thickness of about 10 µm to about 25 µm, and the BPD density at the surface of the buffer layer opposite the substrate may be between about 2/cm$^2$ and about 10/cm$^2$. In some embodiments, the BPD density at the surface may be less than about 2/cm$^2$, and in some embodiments the BPD density at the surface may be less than about 1/cm$^2$.

In some embodiments, the off-axis angle of the buffer layer may be less than 8°. In some embodiments, the off-axis angle of the buffer layer may be about 4°, and in further embodiments, the off-axis angle of the buffer layer may be about 2°. In some embodiments, the off-axis angle of the buffer layer may be between about 4° and about 8°, and in further embodiments, the off-axis angle of the buffer layer may be between about 2° and about 4°. In further embodiments, the off-axis angle of the buffer layer may be between about 2° and about 8°, and in still further embodiments, the off-axis angle of the buffer layer may be between about 0° and about 8°.

Reducing the off-axis angle of the buffer layer may reduce the number of BPDs that reach the surface of the buffer layer, but reducing the off-axis angle by too much can introduce new stacking faults in the epitaxial layer due to the reduced number of steps that are available to be used to replicate the polytype of the underlying material, and the spacing of such steps relative to the diffusion length of silicon and carbon atoms on the growth surface. However, effective reduction in BPDs can be obtained by epitaxial growth on a substrate having an off-axis angle of between about 2° and about 8°, and in some embodiments about 4°, without introducing an unacceptable level of new stacking faults in the epitaxial layer.

Figure 7A:
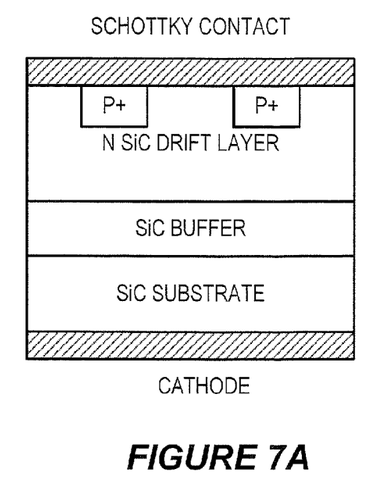
FIGS. 7A-7F illustrate power devices according to some embodiments.
Figure 7B:
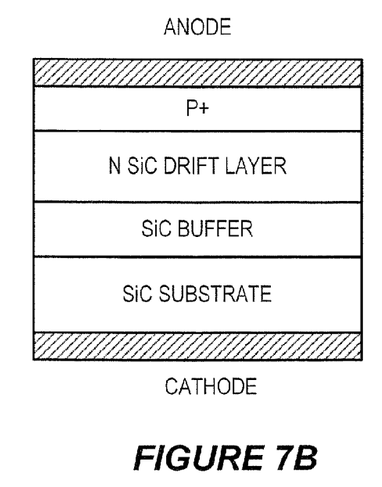
Figure 7C:
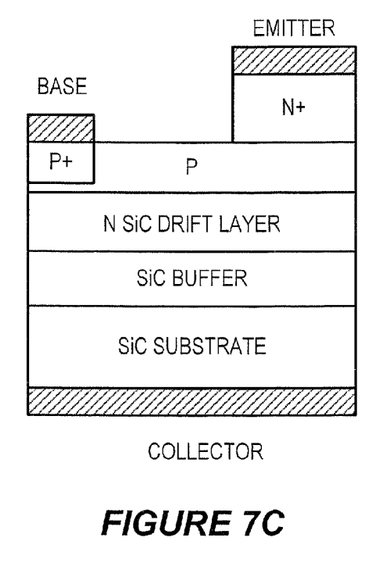
Figure 7D:
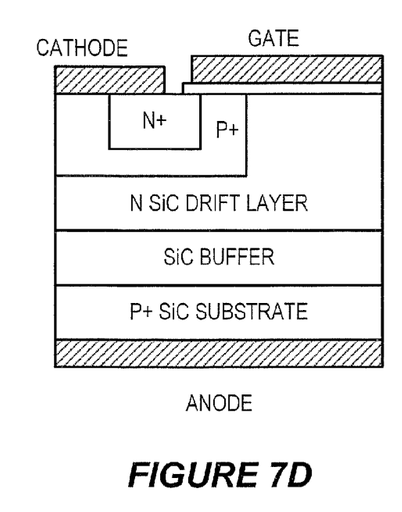
Figure 7E:
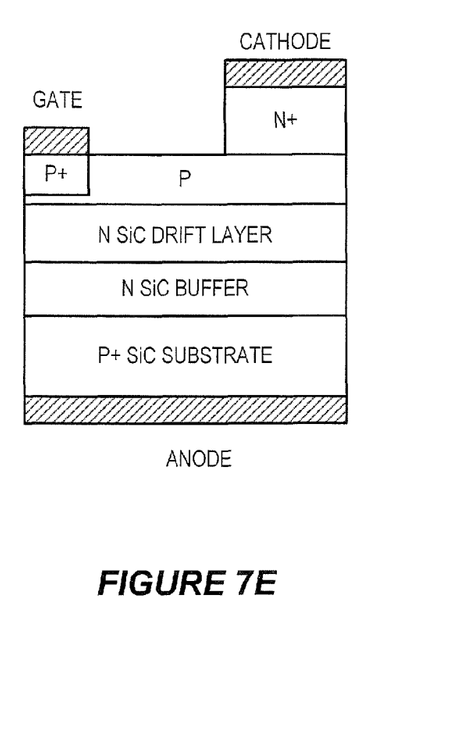
Figure 7F:
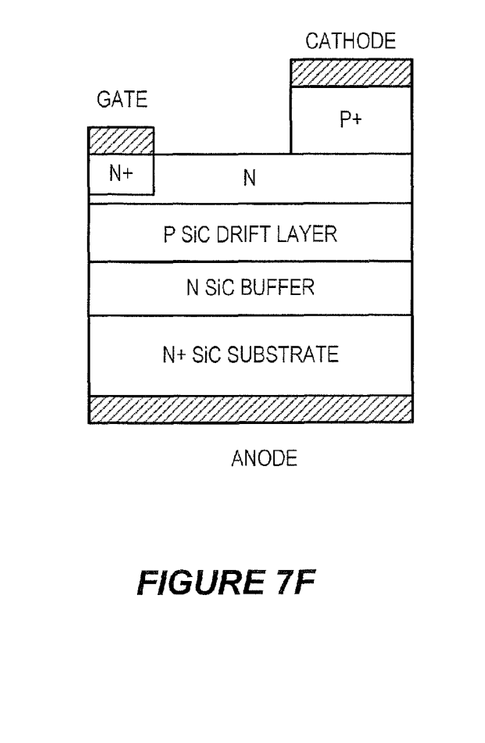

Power devices formed using low-angle off-axis wafers can include bipolar devices, such as merged PIN-Schottky diodes (MPSs) (FIG. 7A), PIN diodes (FIG. 7B), bipolar junction transistors (BJTs) (FIG. 7C), insulated gate bipolar junction transistors (IGBTs) (FIG. 7D), gate turn-off thyristors (GTOs) (FIGS. 7E-7F), MOS-controlled thyristors (MCTs), etc. Unipolar devices that incorporate conductivity modulation to achieve surge capability, such as Schottky diodes with highly doped p+ regions, as well as heterojunction diodes with other materials, such as polysilicon, can also be fabricated using low-angle off-axis wafers according to some embodiments.

Figure 8:
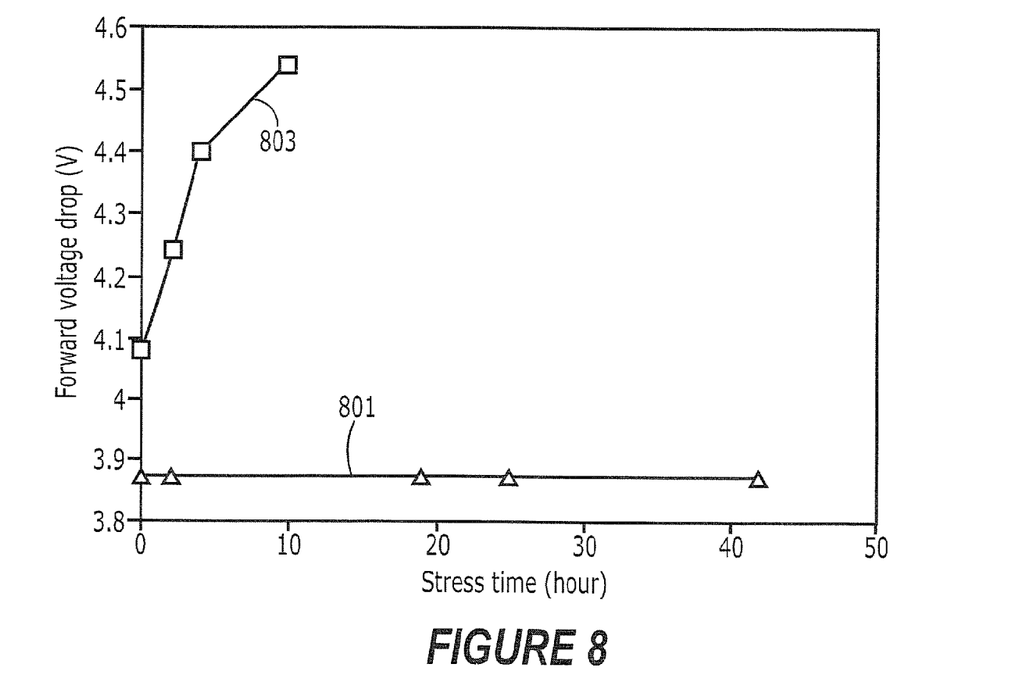
FIG. 8 is a graph of Vf drift versus time during a stress test for a device according to some embodiments.

Improvement of Vf drift in a power device according to some embodiments is illustrated in FIG. 8, which shows a graph of forward voltage drop (Vf)) versus time during a forward current stress test for SiC GTOs formed on a SiC epitaxial layer having a 4° off-axis orientation (Curve 801) and a SiC GTO formed on a SiC epitaxial layer having an 8° off-axis orientation (Curve 803). The forward current stress test was performed using a DC current density of 100 A/cm² at room temperature. The GTO formed on the 4° off-axis showed Vf drift of less than 100 mV after over 40 hours, while the GTO formed on the 8° off-axis showed severe Vf drift after less than 10 hours.

Many of the fabrication techniques referred to herein are, taken individually, generally well-recognized and well-understood in the art and can be practiced without undue experimentation. Single crystal silicon carbide wafers of the type that may be used as starting structures herein are commercially available from Cree, Inc. 4600 Silicon Drive, Durham, N.C. 27706. The growth of silicon carbide epitaxial layers can be carried out using techniques such as those set forth in U.S. Pat. Nos. 4,912,063; 4,912,064; 5,679,153; and 6,297,522. Dry and electrolytic etching of silicon carbide are described in U.S. Pat. Nos. 6,034,001; 5,571,374; 5,227,034; 4,981,551; and 4,865,685. The use of molten potassium hydroxide as an etchant to identify and characterize a semiconductor surface is well-understood, and includes versions expressed as ASTM standards (e.g. ASTM F1404.92). Cutting, mechanical polishing and lapping of substrate wafers are also entirely conventional in this art.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A silicon carbide-based power device, comprising:
    a silicon carbide drift layer having a planar surface that forms an off-axis angle with a <0001> direction that is greater than 2° and less than 4°;
    a silicon carbide substrate having a planar surface that forms an off-axis angle with a <0001>direction of greater than 2° and less than 4°, wherein the silicon carbide drift layer comprises an epitaxial layer on the planar surface of the silicon carbide substrate; and
    a silicon carbide buffer layer between the silicon carbide substrate and the silicon carbide drift layer, wherein the silicon carbide buffer layer has a thickness between about 10 μm and about 25 μm.

2. The silicon carbide based power device of claim 1, wherein the silicon carbide buffer layer has a basal plane dislocation density at a surface opposite the substrate of less than about 10/cm².

3. The silicon carbide based power device of claim 1, wherein the silicon carbide buffer layer has a basal plane dislocation density at the surface opposite the substrate of less than about 2/cm².

4. The silicon carbide based power device of claim 1, wherein the silicon carbide buffer layer has a basal plane dislocation density at the surface opposite the substrate of less than about 1/cm².

5. The silicon carbide based power device of claim 1, wherein the silicon carbide buffer layer is on a carbon face of the substrate.

6.
    a silicon carbide-based power device, comprising;
    a silicon carbide drift layer having a planar surface the forms an off-axis angle with a <0001> direction that is less than 2°;
    wherein the silicon carbide drift layer has a first conductivity type, the silicon carbide based power device comprising a gate turn off thyristor including a silicon carbide substrate having a second conductivity type opposite the first conductivity type and a silicon carbide buffer layer on the substrate, wherein the drift layer is on the buffer layer, a first epitaxial layer on the drift layer and having the second conductivity type, a second epitaxial layer on the first epitaxial layer and having the first conductivity type, a gate contact on the first epitaxial layer, a cathode contact on the second epitaxial layer and an anode contact on the substrate.

7. The silicon carbide based power device of claim 6, wherein the device has a forward voltage drift of less than 100 mV after 40 hours of conducting forward current.

8. A method of forming a silicon carbide-based power device, comprising:
    forming a silicon carbide substrate having a planar surface that forms an off-axis angle with a <0001>direction of greater than 2° and less than 4°;
    forming a silicon carbide buffer layer on the silicon carbide substrate, wherein the silicon carbide buffer layer has a thickness between about 10 μm and about 25 μm; and
    forming a silicon carbide drift layer on the buffer layer, the silicon carbide drift layer having a planar surface that forms an off-axis angle with a <0001>direction of greater than 2° and less than 4°.

9. A method of forming a silicon carbide-based power device, comprising:
    forming a silicon carbide drift layer having a planar surface that forms an off-axis angle with a <0001> direction of less than 8°;
    wherein the silicon carbide drift layer is formed by chemical vapor deposition including a chlorine containing compound that produces a dynamic co-etching rate of the silicon carbide drift layer of between 0.5 and 3 microns per hour.

10. The method of claim 9, wherein chemical vapor deposition is performed at a temperature greater than 1600° C.

11. The method of claim 9, wherein chemical vapor deposition performed at a temperature between 1600° C. and 1800° C.

* * * * *

UNITED STATES PATENT AND TRADEMARK OFFICE
CERTIFICATE OF CORRECTION

PATENT NO.        : 8,536,582 B2                                              Page 1 of 1
APPLICATION NO.   : 12/622861
DATED             : September 17, 2013
INVENTOR(S)       : Zhang et al.

It is certified that error appears in the above-identified patent and that said Letters Patent is hereby corrected as shown below:

In the Specification:
Column 5, Line 49: Please correct "about 10 μm In" to read -- about 10 μm. In --

In the Claims:
Column 14, Claim 6, Line 12: Please correct "a silicon carbide-based"
　　　　　　　　　　　　　　　 to read -- A silicon carbide-based --

Column 14, Claim 6, Lines 13-14: Please correct "surface the forms"
　　　　　　　　　　　　　　　　 to read -- surface that forms --

Signed and Sealed this
Tenth Day of February, 2015

Michelle K. Lee
*Deputy Director of the United States Patent and Trademark Office*